(12) United States Patent
Ning et al.

(10) Patent No.: US 9,905,580 B2
(45) Date of Patent: Feb. 27, 2018

(54) METHOD FOR MANUFACTURING THIN FILM TRANSISTOR, THIN FILM TRANSISTOR, AND ARRAY SUBSTRATE AND DISPLAY DEVICE USING THE SAME

(71) Applicant: BOE TECHNOLOGY GROUP CO., LTD., Beijing (CN)

(72) Inventors: Ce Ning, Beijing (CN); Mingchao Li, Beijing (CN); Fangzhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/911,213

(22) PCT Filed: Jul. 20, 2015

(86) PCT No.: PCT/CN2015/084446
§ 371 (c)(1),
(2) Date: Feb. 9, 2016

(87) PCT Pub. No.: WO2016/155155
PCT Pub. Date: Oct. 6, 2016

(65) Prior Publication Data
US 2017/0040342 A1 Feb. 9, 2017

(30) Foreign Application Priority Data

Apr. 1, 2015 (CN) .......................... 2015 1 0152719

(51) Int. Cl.
*H01L 29/82* (2006.01)
*H01L 27/12* (2006.01)
(Continued)

(52) U.S. Cl.
CPC ........ *H01L 27/124* (2013.01); *H01L 27/1259* (2013.01); *H01L 29/401* (2013.01); *H01L 29/66742* (2013.01); *H01L 29/786* (2013.01)

(58) Field of Classification Search
CPC .............. H01L 27/124; H01L 27/1259; H01L 29/66742; H01L 29/401; H01L 29/786
See application file for complete search history.

(56) References Cited

U.S. PATENT DOCUMENTS

2003/0037843 A1\* 2/2003 Hishida .................... C23C 8/10
148/284
2005/0199888 A1 9/2005 Seong et al.
(Continued)

FOREIGN PATENT DOCUMENTS

CN 1622300 A 6/2005
CN 101137933 A 3/2008
(Continued)

OTHER PUBLICATIONS

First Office Action regarding Chinese Application No. 201510152719.1, dated Apr. 13, 2017. Translation provided by Dragon Intellectual Property Law Firm.
(Continued)

*Primary Examiner* — Cuong Q Nguyen
*Assistant Examiner* — Nishath Yasmeen
(74) *Attorney, Agent, or Firm* — Harness, Dickey & Pierce, P.L.C.

(57) ABSTRACT

The present disclosure relates to the field of display technology and provides a method for manufacturing a TFT, the TFT, an array substrate including the TFT, and a display device. The method includes steps of forming a pattern of a gate electrode on 5 a base substrate, forming a gate insulation layer on the base substrate, and forming patterns of a source electrode and a drain electrode arranged above the
(Continued)

gate insulation layer. The method further includes forming an antioxidation metal protection layer on a surface or surfaces of the gate electrode, the source electrode and/or the drain electrode.

8 Claims, 2 Drawing Sheets

(51) Int. Cl.
*H01L 29/786* (2006.01)
*H01L 29/40* (2006.01)
*H01L 29/66* (2006.01)

(56) References Cited

U.S. PATENT DOCUMENTS

| | | | |
|---|---|---|---|
| 2006/0203181 A1* | 9/2006 | Han | G02F 1/1368 349/187 |
| 2010/0219402 A1 | 9/2010 | Katsuhara et al. | |
| 2014/0077213 A1 | 3/2014 | Zhang et al. | |
| 2014/0125909 A1 | 5/2014 | Kim et al. | |
| 2015/0194498 A1 | 7/2015 | Yuan | |
| 2017/0040342 A1 | 2/2017 | Ning et al. | |

FOREIGN PATENT DOCUMENTS

| | | |
|---|---|---|
| CN | 101174650 A | 5/2008 |
| CN | 102224580 A | 10/2011 |
| CN | 102645803 A | 8/2012 |
| CN | 102769040 A | 11/2012 |
| CN | 103227208 A | 7/2013 |
| CN | 103247531 A | 8/2013 |
| CN | 104617042 A | 5/2015 |
| CN | 104766803 A | 7/2015 |
| CN | 104882489 A | 9/2015 |
| JP | 2002-110678 A | 4/2002 |

OTHER PUBLICATIONS

International Search Report and Written Opinion of the International Searching Authority for International Application No. PCT/CN2015/084446, dated Dec. 25, 2015. Translation provided by Dragon Intellectual Property Law Firm.

* cited by examiner

METHOD FOR MANUFACTURING THIN FILM TRANSISTOR, THIN FILM TRANSISTOR, AND ARRAY SUBSTRATE AND DISPLAY DEVICE USING THE SAME

CROSS-REFERENCE TO RELATED APPLICATION APPLICATIONS

This application is the U.S. national phase of PCT Application No. PCT/CN2015/084446 filed on Jul. 20, 2015, which claims a priority of the Chinese Patent Application No. 201510152719.1 filed on Apr. 1, 2015, the disclosures of which are incorporated in their entirety by reference herein.

TECHNICAL FIELD

The present disclosure relates to the field of display technology, in particular to a method for manufacturing a thin film transistor (TFT), the TFT, an array substrate using the TFT, and a display device.

BACKGROUND

Recently, Cathode Ray Tube (CRT) display has been gradually replaced by a Liquid Crystal Display (LCD) or an Organic Light-Emitting diode (OLED) display in televisions, mobile phones, computers or laptop computers due to such advantages as small volume, small weight, low power consumption, vivid colors and vivid images.

Usually, the LCD or OLED display is provided with a TFT array substrate which includes a plurality of pixel units. Each pixel unit corresponds to one TFT which functions as a switching element for controlling a state of the corresponding pixel unit. Generally, the TFT corresponding to each pixel unit is required to have a high switching speed during the use of the LCD and OLED display with a large area and a high resolution, so there is a high demand on the conductivity of electrodes of the TFT.

Currently, each electrode of the TFT is usually made of an elemental metal having well conductivity. However, the elemental metal maybe readily oxidized in a subsequent process, and as a result, its conductivity will be deteriorated.

SUMMARY

An object of the present disclosure is to provide a method for manufacturing a TFT, the TFT, an array substrate using the TFT, and a display device, so as to improve the conductivity of the electrodes of the TFT.

In one aspect, the present disclosure provides in some embodiments a method for manufacturing a TFT, including steps of: forming a pattern of a gate electrode on a base substrate; forming a gate insulation layer on the base substrate; and forming patterns of a source electrode and a drain electrode arranged above the gate insulation layer. The method further includes forming an antioxidation metal protection layer on a surface or surfaces of the gate electrode, the source electrode and/or the drain electrode.

Alternatively, the metal protection layer is made of an elemental metal, and the gate electrode, the source electrode and/or the drain electrode are each made of an elemental metal having chemical activity greater than the elemental metal of the metal protection layer.

Alternatively, the step of forming the metal protection layer includes immersing the base substrate with the electrodes into a solution containing metal ions corresponding to the elemental metal of the metal protection layer, and replacing the elemental metal on the surface of each electrode with the metal ions in the solution, thereby forming the metal protection layer on the surface of each electrode.

Alternatively, the metal protection layer is formed on the surfaces of the gate electrode, the source electrode and the drain electrode, the metal protection layer is made of an elemental metal, and the gate electrode, the source electrode and the drain electrode are each made of an elemental metal having chemical activity greater than the elemental metal of the metal protection layer. The step of forming the antioxidation metal protection layer on the surface of the gate electrode includes immersing the base substrate with the gate electrode into a solution containing metal ions corresponding to the elemental metal of the metal protection layer, and replacing the elemental metal on the surface of the gate electrode with the metal ions in the solution, thereby forming the metal protection layer on the surface of the gate electrode. The step of forming the metal protection layer on the surfaces of the source electrode and the drain electrode includes immersing the substrate with the source electrode and the drain electrode into a solution containing metal ions corresponding to the elemental metal of the metal protection layer, and replacing the elemental metal on the surfaces of the source electrode and the drain electrode with the metal ions in the solution, thereby forming the metal protection layer on the surfaces of the source electrode and the drain electrode.

Alternatively, the gate electrode, the source electrode and the drain electrode are each made of copper, and the metal protection layer is made of silver.

Alternatively, when a common electrode is formed on the base substrate, the step of forming the pattern of the gate electrode on the base substrate includes: depositing a transparent conductive layer and a gate metal layer made of a first elemental metal sequentially onto the base substrate; forming the pattern of the electrode on the gate metal layer and forming a pattern of the common electrode on the transparent conductive layer by a single patterning process; annealing the common electrode by placing the base substrate with the common electrode and the gate electrode into an annealing furnace; and immersing the base substrate with the annealed common electrode into a solution containing metal ions corresponding to a second elemental metal having chemical activity lower than the first elemental metal, and replacing the gate electrode made of the first elemental metal with the gate electrode made of the second elemental metal corresponding to the metal ions in the solution.

Alternatively, subsequent to depositing the gate insulation layer onto the base substrate and prior to forming the source electrode and the drain electrode, the method further includes forming on the gate insulation layer a pattern of an active layer on which the source electrode and the drain electrode are arranged.

In another aspect, the present disclosure provides in some embodiments a TFT manufactured by the on-mentioned method. The TFT includes a gate electrode arranged on a base substrate, a gate insulation layer covering the gate electrode and the base substrate, and a source electrode and a drain electrode arranged above the gate insulation layer and at an identical layer. An antioxidation metal protection layer is arranged on a surface or surfaces of the gate electrode, the source electrode and/or the drain electrode.

Alternatively, the metal protection layer is made of an elemental metal, and the gate electrode, the source electrode and/or the drain electrode are each made of an elemental metal having chemical activity greater than the elemental metal of the metal protection layer.

Alternatively, the metal protection layer is formed on the surfaces of the gate electrode, the source electrode and the drain electrode, the gate electrode, the source electrode and the drain electrode are each made of copper, and the metal protection layer is made of silver.

Alternatively, a common electrode is formed on the base substrate and arranged at a layer identical to but insulated from the gate electrode.

In yet another aspect, the present disclosure further provides in some embodiments an array substrate including the on-mentioned TFTs arranged in an array form.

In still yet another aspect, the present disclosure further provides in some embodiments a display device including the on-mentioned array substrate.

According to the embodiments of the present disclosure, the metal protection layer is formed on the surface or surfaces of the gate electrode, the source electrode and/or the drain electrode. As a result, during the subsequent manufacture of the TFT, it is able to prevent the surface or surfaces of the gate electrode, the source electrode and/or the drain electrode from being exposed to the outside, thereby to prevent the surface or surfaces from being oxidized and effectively improve the conductivity of the electrodes of the TFT.

BRIEF DESCRIPTION OF THE DRAWINGS

The following drawings are provided so as to facilitate the understanding of the present disclosure, and the following embodiments are for illustrative purposes only, but shall not be used to limit the scope of the present disclosure.

DETAILED DESCRIPTION OF THE EMBODIMENTS

Figure 1:
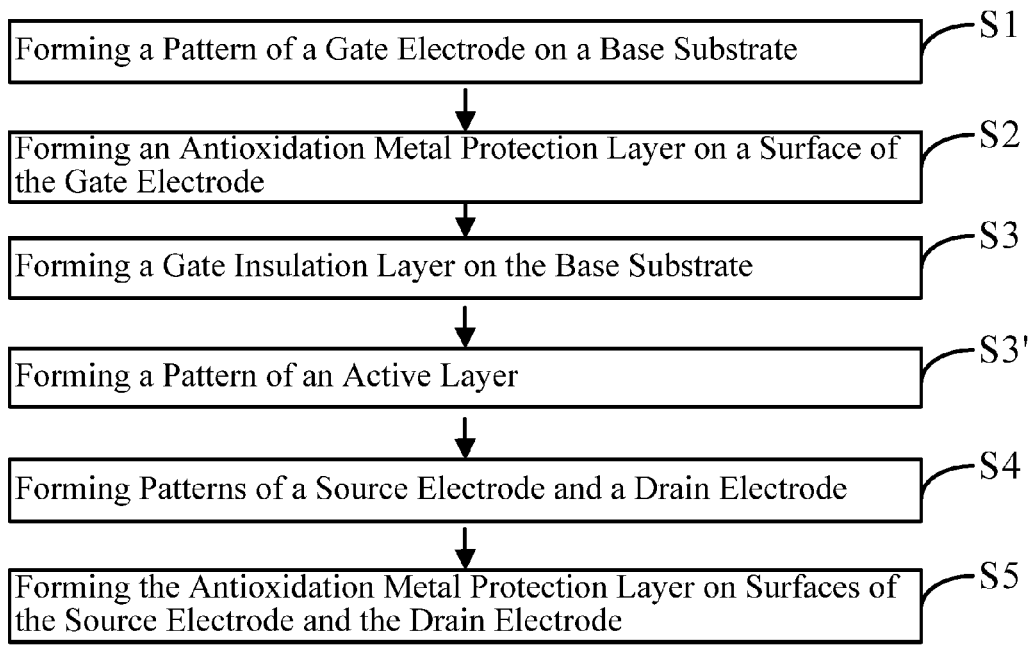
FIG. 1 is a flow chart of a method for manufacturing a TFT according to one embodiment of the present disclosure.

The present disclosure will be described hereinafter in conjunction with the drawings and embodiments, and the following embodiments shall not be used to limit the scope of the present disclosure.

The present disclosure provides in some embodiments a method for manufacturing a TFT, which includes steps of forming a pattern of a gate electrode on a base substrate, forming a gate insulation layer on the base substrate, and forming patterns of a source electrode and a drain electrode above the gate insulation layer. The method further includes forming an antioxidation metal protection layer on a surface or surfaces of the gate electrode, the source electrode and/or the drain electrode.

Alternatively, the step of forming the pattern of the gate electrode on the base substrate includes depositing a gate metal layer onto the base substrate, applying a photoresist onto the gate metal layer, exposing and developing the photoresist with a mask plate so as to determine a position and the pattern of the gate electrode, and removing the undesired gate metal layer and the photoresist by an etching process, thereby forming the pattern of the gate electrode on the base substrate.

In the embodiments of the present disclosure, the steps of applying the photoresist, exposing and developing the photoresist with the mask plate and removing the undesired gate metal layer and the photoresist are collectively referred to a single patterning process. Unless otherwise defined, the single patterning process includes the steps of applying the photoresist, exposing the developing the photoresist and etching the photoresist.

Alternatively, the step of forming the patterns of the source electrode and the drain electrode above the gate insulation layer includes depositing a source/drain metal layer on the gate insulation layer, and forming the patterns of the source electrode and the drain electrode by a single patterning process.

According to the method for manufacturing the TFT in the embodiments of the present disclosure, the metal protection layer is formed on the surface or surfaces of the gate electrode, the source electrode and/or the drain electrode. As a result, during the subsequent manufacture of the TFT, it is able to prevent the surface or surfaces of the gate electrode, the source electrode and/or the drain electrode from being exposed to the outside, thereby to prevent the surface or surfaces from being oxidized and effectively improve the conductivity of the electrodes of the TFT.

In addition, when the gate insulation layer covering the gate electrode is an oxide gate insulation layer, the metal protection layer is formed on the surface of the gate electrode, so it is able to prevent the gate electrode from being directly in contact with the oxide gate insulation layer. As a result, when the TFT is annealed subsequently, it is able to prevent the surface of the gate electrode from being oxidized by the oxygen contained in the oxide gate insulation layer, thereby to further improve the conductivity of the electrodes of the TFT.

In the embodiments of the present disclosure, generally speaking, a passivation layer for protecting the source electrode and the drain electrode may also be formed on the source electrode and the drain electrode of the TFT. Usually, the passivation layer is made of one or more of $SiO_x$, SiON or $SiN_x$. When the passivation layer covering the source electrode and the drain electrode is an oxide passivation layer, the metal protection layer is formed on the surfaces of the source electrode and the drain electrode, so it is able to prevent the source electrode and/or the drain electrode from being directly in contact with the oxide passivation layer. As a result, when the TFT is annealed subsequently, it is able to prevent the surfaces of the source electrode and/or the drain electrode from being oxidized due to the oxygen contained in the oxide passivation layer, thereby to further improve the conductivity of the electrodes of the TFT.

Alternatively, after the formation of the passivation layer on the source electrode and the drain electrode, the drain electrode of the TFT needs to be connected to a pixel electrode on an array substrate. Usually, a via-hole may be provided in the passivation layer, and the pixel electrode may be connected to the drain electrode through the via-hole. However, after the formation of the via-hole in the passivation layer, a portion of the surface of the drain electrode may be exposed. In this case, when the antioxidation metal protection layer is formed on the surface of the drain electrode, it is able to prevent the portion of the surface of the drain electrode from being exposed to the outside after the formation of the via-hole, thereby to prevent the surface of the drain electrode from being oxidized and further improve the conductivity of the electrodes of the TFT.

Alternatively, the gate insulation layer may be formed by Plasma Enhanced Chemical Vapor Deposition (PECVD), and it may be made of one or more of $SiN_x$, SiON and $SiO_x$. The gate insulation layer may be of a single-layered or multi-layered structure, and have a thickness of 300 nm to 500 nm.

In the embodiments of the present disclosure, the gate electrode, the source electrode and/or the drain electrode may, for example, be each made of an elemental metal or an alloy, and the metal protection layer may also be made of an elemental metal or an alloy.

Alternatively, the metal protection layer is made of an elemental metal, and the gate electrode, the source electrode and/or the drain electrode are each made of an elemental metal having chemical activity greater than the elemental metal of the metal protection layer.

For example, the gate electrode, the source electrode and/or the drain electrode are each made of an elemental metal. The elemental metal of the gate electrode has chemical activity greater than the elemental metal of the metal protection layer on the surface of the gate electrode, the elemental metal of the source electrode has chemical activity greater than the elemental metal of the metal protection layer on the surface of the source electrode, and the elemental metal of the drain electrode has chemical activity greater than the elemental metal of the metal protection layer on the surface of the drain electrode.

In the embodiments of the present disclosure, the metal protection layer may be formed on the surface or surfaces of the gate electrode, the source electrode and/or the drain electrode in various ways. For example, the metal protection layer may be directly formed on the surface or surfaces of the gate electrode, the source electrode and/or the drain electrode by sputtering or evaporation.

Alternatively, the step of forming the metal protection layer on the surface or surfaces of the gate electrode, the source electrode and/or the drain electrode includes immersing the base substrate with the electrodes into a solution containing metal ions corresponding to the elemental metal of the metal protection layer, and replacing the elemental metal on the surface of each electrode with the metal ions in the solution, thereby forming the metal protection layer on the surface of each electrode.

For example, when it is required to form the metal protection layer on the surface of the gate electrode, the gate electrode is made of an elemental metal having chemical activity greater than the elemental metal of the metal protection layer on the surface of the gate electrode. At this time, the base substrate with the gate electrode is immersed into a solution containing metal ions corresponding to the elemental metal of the metal protection layer, and the elemental metal on the surface of the gate electrode is replaced by the metal ions in the solution, so as to form the metal protection layer on the surface of the gate electrode.

Alternatively, the procedure of forming the metal protection layer on the surface or surfaces of the source electrode and/or the drain electrode is similar to that of forming the metal protection layer on the surface of the gate electrode.

In the above-mentioned embodiments, the replacement reaction is performed between the elemental metal on the surface or surfaces of the gate electrode, the source electrode and/or the drain electrode and the metal ions in the solution. To be specific, electrons are transferred from the elemental metal on the surface of the gate electrode, the source electrode and/or the drain electrode to the metal ions in the solution, and the metal ions in the solution obtain the electrons, they may replace the elemental metal ions on the surface or surfaces of the gate electrode, the source electrode and/or the drain electrode, whose electrons have been lost. Finally, the metal protection layer may be formed on the surface or surfaces of the gate electrode, the source electrode and/or the drain electrode. As compared with the metal protection layer formed by sputtering or evaporation, there is a stronger binding force between the metal protection layer obtained by the replacement reaction and the surface or surfaces of the gate electrode, the source electrode and/or the drain electrode. In addition, through the replacement reaction, it is able to obtain a more uniform and compact metal protection layer and provide a better antioxidation effect, thereby to effectively prevent oxidation of the surface or surfaces of the gate electrode, the source electrode and/or the drain electrode and improve the conductivity of the electrodes of the TFT.

In the embodiments of the present disclosure, the metal protection layer may be formed on a surface or surfaces of one, two or all of the gate electrode, the source electrode and the drain electrode.

Alternatively, the metal protection layer may be formed on the surfaces of the gate electrode, the source electrode and the drain electrode. Referring to FIG. 1, when the metal protection layer is formed on the surfaces of the gate electrode, the source electrode and the drain electrode, the method includes Step S1 of forming a pattern of the gate electrode on the base substrate, Step S2 of forming the antioxidation metal protection layer on the surface of the gate electrode, Step S3 of forming the gate insulation layer on the base substrate, Step S4 of forming patterns of the source electrode and the drain electrode above the gate insulation layer, and Step S5 of forming the antioxidation metal protection layer on the surfaces of the source electrode and the drain electrode.

The metal protection layer is formed on the surfaces of the gate electrode, the source electrode and the drain electrode, the metal protection layer is made of an elemental metal, and the gate electrode, the source electrode and the drain electrode are each made of an elemental metal having chemical activity greater than the elemental metal of the metal protection layer.

In addition, the step of forming the antioxidation metal protection layer on the surface of the gate electrode includes immersing the base substrate with the gate electrode into a solution containing metal ions corresponding to the elemental metal of the metal protection layer, and replacing the elemental metal on the surface of the gate electrode with the metal ions in the solution, i.e., enabling electrons to be transferred from the elemental metal on the surface of the gate electrode to the metal ions in the solution and enabling the metal ions in the solution, after acquiring the electrons, to replace the elemental metal on the surface of the gate electrode, whose electrons have been lost, thereby forming the metal protection layer on the surface of the gate electrode.

In addition, the step of forming the metal protection layer on the surfaces of the source electrode and the drain electrode includes immersing the substrate with the source electrode and the drain electrode into a solution containing metal ions corresponding to the elemental metal of the metal protection layer, and replacing the elemental metal on the surfaces of the source electrode and the drain electrode with the metal ions in the solution, i.e., enabling electrons to be transferred from the elemental metal on the surfaces of the source electrode and the drain electrode to the metal ions in the solution and enabling the metal ions in the solution, after acquiring the electrons, to replace the elemental metal on the surfaces of the source electrode and the drain electrode, whose electrons have been lost, thereby forming the metal protection layer on the surfaces of the source electrode and the drain electrode.

In the embodiments of the present disclosure, usually the gate electrode, the source electrode and the drain electrode of the TFT may be made of an elemental metal having low resistivity and low production cost, such as aluminum or copper.

Alternatively, the gate electrode, the source electrode and the drain electrode are each made of copper. As compared with aluminum, copper has low resistivity, and when the TFTs are of an identical structure and an identical size, copper may be used to reduce the resistances of the gate electrode, the source electrode and the drain electrode, so as to improve the conductivity of the electrodes, i.e., the gate electrode, the source electrode and the drain electrode, of the TFT.

In addition, when the gate electrode, the source electrode and the drain electrode of the TFT are each of a predetermined length and of an identical resistance, copper may be adopted to reduce sectional areas of the gate electrode, the source electrode and the drain electrode due to its low resistivity. In addition, the gate electrode, the source electrode and the drain electrode of the TFT are each of a predetermined thickness, so when copper is adopted, it is able to reduce widths of the gate electrode, the source electrode and the drain electrode. At this time, when the TFT is formed on the array substrate, it is able to reduce an area occupied by the TFT on the array substrate, thereby to facilitate the application of the TFT to the LCD or OLED display with a high resolution.

In the embodiments of the present disclosure, the metal protection layer may be made of various materials.

Alternatively, the metal protection layer may be made of silver. Silver is chemically inert, and when it is adopted to form the metal protection layer, it is able to effectively prevent the metal protection layer from being oxidized rapidly, thereby to prevent the gate electrode, the source electrode and the drain electrode covered by the metal protection layer from being oxidized. In addition, silver has resistivity lower than copper, and when it is adopted to form the metal protection layer, it is able to effectively improve the conductivity of the electrodes of the TFT. When the metal protection layer is made of silver, $AgNO_3$ or $Ag_2SO_4$ may be used as the solution containing silver ions.

Figure 2:
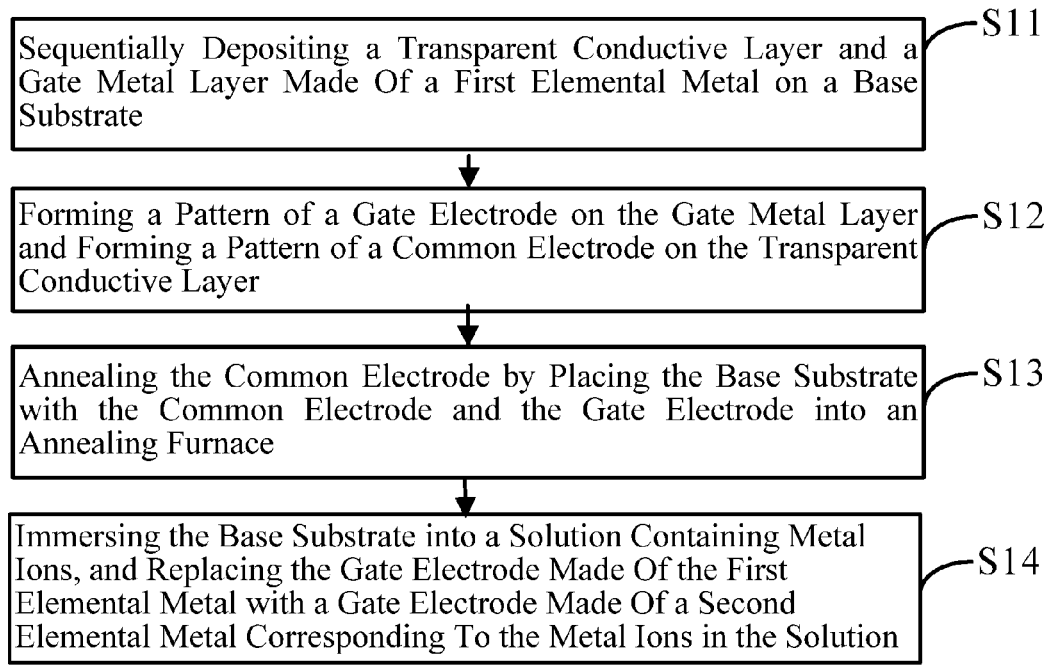
FIG. 2 is a flow chart of a method for manufacturing a gate electrode according to one embodiment of the present disclosure.

Alternatively, a common electrode may also be formed on the base substrate. Referring to FIG. 2, when the common electrode is formed on the base substrate, the step of forming the pattern of the gate electrode on the base substrate includes Step S11 of depositing a transparent conductive layer and a gate metal layer made of a first elemental metal sequentially onto the base substrate, Step S12 of forming the pattern of the gate electrode on the gate metal layer and forming a pattern of the common electrode on the transparent conductive layer by a single patterning process, Step S13 of annealing the common electrode by placing the base substrate with the common electrode and the gate electrode into an annealing furnace, and Step S14 of immersing the base substrate with the annealed common electrode into a solution containing metal ions corresponding to a second elemental metal having chemical activity lower than the first elemental metal, and replacing the gate electrode made of the first elemental metal with the gate electrode made of the second elemental metal corresponding to the metal ions in the solution.

For example, the gate electrode made of aluminum may be formed in advance on the base substrate, and then the gate electrode made of aluminum may be replaced with the gate electrode made of copper. To be specific, the step of forming the pattern of the gate electrode on the base substrate includes the following steps.

At first, a transparent conductive layer and a gate metal layer made of aluminum may be sequentially deposited onto the base substrate. Then, the pattern of the gate electrode may be formed on the gate metal layer and the pattern of a common electrode may be formed on the transparent conductive layer by half-tone photomasking. Next, the base substrate with the common electrode and the gate electrode made of aluminum may be placed into an annealing furnace, so as to anneal the common electrode at a temperature of 230□ to 250□ and for 20 min to 60 min.

Finally, the base substrate with the annealed common electrode is immersed into a solution containing copper ions, and aluminum contained in the gate electrode is replaced by the copper ions in the solution, i.e., electrons are transferred from aluminum to the copper ions and the gate electrode made of aluminum is replaced with the gate electrode made of copper. Such a soluble cupric salt solution as $CuSO_4$, $Cu(NO_3)_2$ or $CuCl_2$ may be adopted as the solution containing copper ions.

In the above-mentioned embodiments, the pattern of the gate electrode made of the first elemental metal is formed on the base substrate in advance, and the desired gate electrode made of the second elemental metal is formed by the replacement reaction. As compared with the situation where the desired gate electrode made of the second elemental metal is directly formed on the base substrate, it is able to prevent the desired gate electrode made of the second elemental metal from being oxidized when the common electrode is annealed, thereby to further improve the conductivity of the electrodes of the TFT.

In the above-mentioned embodiments, the transparent conductive layer may be made of indium tin oxide (ITO) or indium zinc oxide (IZO) and have a thickness of 30 nm to 70 nm., and the gate metal layer may have a thickens of 200 nm to 400 nm.

In the embodiments of the present disclosure, the patterns of the common electrode and the gate electrode made of the first elemental metal may be formed on the base substrate mainly in the following two ways.

In a first way, a transparent conductive layer may be deposited onto the base substrate, and the pattern of the common electrode may be formed on the transparent conductive layer by a single patterning process. Then, a gate metal layer made of the first elemental metal may be deposited onto the base substrate with the common electrode, and the pattern of the gate electrode made of the first elemental metal may be formed by a single patterning process.

In a second way, a transparent conductive layer may be deposited onto the base substrate, and a gate metal layer made of the first elemental metal may be deposited onto the transparent conductive layer. Then, the pattern of the gate electrode may be formed on the gate metal layer and the pattern of the common electrode may be formed on the transparent conductive layer by half-tone photomasking. The gate electrode includes the gate metal layer and the transparent conductive layer under the gate metal layer.

Alternatively, the second way is used so as to form the patterns of the common electrode and the gate electrode made of the first elemental metal on the base substrate, where merely a single patterning process is adopted. As a result, it is able to reduce the number of mask plates used in the patterning processes, thereby to reduce the production cost. In addition, as compared with the first way, it is able for the second way to reduce the time desired for forming the patterns of the gate electrode and the common electrode.

Generally speaking, the TFT includes an active layer. In the embodiments of the present disclosure, the active layer may be formed on the gate insulation layer, and the source electrode and the drain electrode may be arranged on the active layer. The active layer may also be formed on the source electrode and the drain electrode, and the source electrode and the drain electrode may be arranged on the gate insulation layer.

Alternatively, the active layer is formed on the gate insulation layer, and the source electrode and the drain electrode are arranged on the active layer. Referring to FIG. 1, the active layer may be formed by Step 3'.

Subsequent to depositing the gate insulation layer onto the base substrate and prior to forming the source electrode and the drain electrode, the method further includes Step S3' of forming on the gate insulation layer a pattern of the active layer on which the source electrode and the drain electrode are arranged.

For example, a semiconductor layer may be deposited onto the gate insulation layer, and the pattern of the active layer may then be formed on the gate insulation layer by a single patterning process. The active layer may be made of indium gallium zinc oxide (IGZO), indium oxide ($In_2O_3$) or zinc oxide (ZnO), and have a thickness of 30 nm to 100 nm.

Alternatively, the patterns of the active layer, the source electrode and the drain electrode may be formed by a single patterning process, so as to reduce the production cost and save the time. To be specific, a semiconductor layer may be deposited onto the gate insulation layer, and then a source/drain metal layer may be deposited onto the semiconductor layer. Next, the patterns of the source electrode and the drain electrode may be formed on the source/drain metal layer and the pattern of the active layer may be formed on the semiconductor layer by half-tone photomasking or grayscale photomasking.

Figure 3:
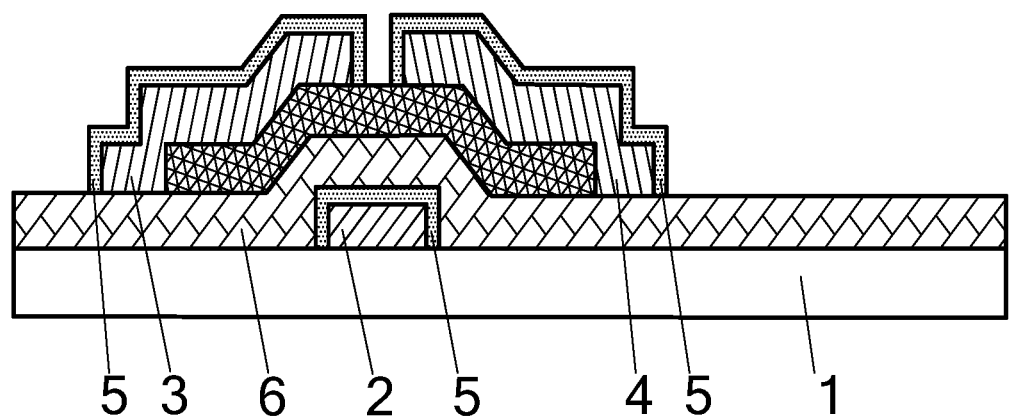
FIG. 3 is a sectional view of the TFT according to one embodiment of the present disclosure.
Figure 4:
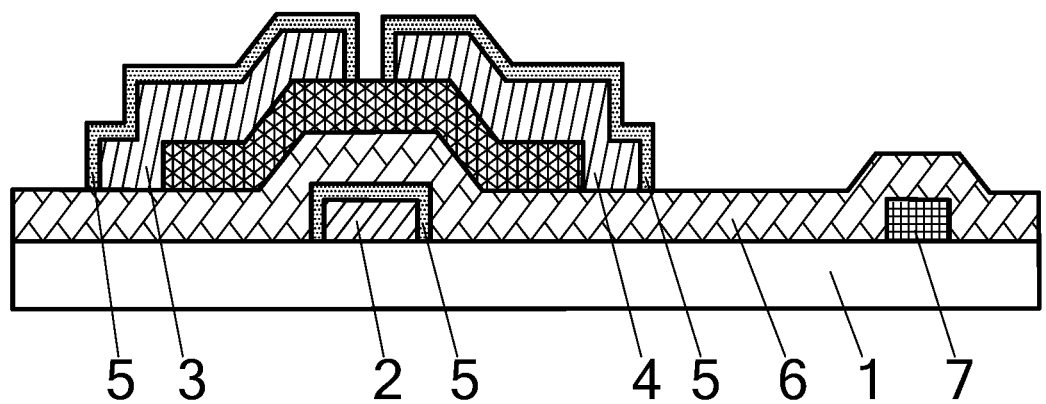
FIG. 4 is another sectional view of the TFT according to one embodiment of the present disclosure.

The present disclosure further provides in some embodiments a TFT manufactured by the above-mentioned method. Referring to FIG. 3 or 4, the TFT includes a gate electrode 2 arranged on a base substrate 1, a gate insulation layer 6 covering the gate electrode 2 and the base substrate 1, and a source electrode 3 and a drain electrode 4 arranged above the gate insulation layer 6 and at an identical layer. An antioxidation metal protection layer 5 is arranged on a surface or surfaces of the gate electrode 2, the source electrode 3 and/or the drain electrode 4.

In the embodiments of the present disclosure, the gate electrode 2, the source electrode 3 and/or the drain electrode 4 may be each made of an elemental metal or an alloy, and the metal protection layer 5 may also be made of an elemental metal or an alloy.

Alternatively, the metal protection layer 5 is made of an elemental metal, and the gate electrode 2, the source electrode 3 and/or the drain electrode 4 are each made of an elemental metal having chemical activity greater than the elemental metal of the metal protection layer 5.

In the embodiments of the present disclosure, the metal protection layer 5 may cover a surface or surfaces of one, two or all of the gate electrode 2, the source electrode 3 and the drain electrode 4.

Alternatively, the metal protection layer 5 may be arranged on the surfaces of the gate electrode 2, the source electrode 3 and the drain electrode 4. The gate electrode 2, the source electrode 3 and the drain electrode 4 may be made of copper, and the metal protection 5 may be made of silver.

Referring to FIG. 4, a common electrode 7 may also be arranged on the base substrate 1, and it may be arranged at an identical layer but insulated from the gate electrode 2.

The above embodiments or examples are provided in a progressive manner, and the same or similar portions of the embodiments or example are not repeated, i.e., each embodiment or example merely shows the difference from the other embodiments or examples. Particularly, the embodiments concerning the product may refer to the embodiments concerning the method.

The present disclosure further provides in some embodiments an array substrate including the above-mentioned TFTs arranged in an array form. The advantages of the array substrate may refer to those of the TFT mentioned above, and thus will not be repeated herein.

The present disclosure further provides in some embodiments a display device including the above-mentioned array substrate. The advantages of the display device may refer to those of the array substrate mentioned above, and thus will not be repeated herein. The display device may be any product or member having a display function, such as a liquid crystal display device, an electronic paper, a mobile phone, a flat-panel computer, a television, a laptop computer, a digital photo frame or a navigator.

Any features, structures or materials may be combined in any appropriate manner in one or more embodiments or examples.

The above are merely the preferred embodiments of the present disclosure. A person skilled in the art may make further modifications and improvements without departing from the spirit of the present disclosure, and these modifications and improvements shall also fall within the scope of the present disclosure.

What is claimed is:

1. A method for manufacturing a thin film transistor (TFT), comprising steps of:
    forming a pattern of a gate electrode on a base substrate;
    forming a gate insulation layer on the base substrate;
    forming patterns of a source electrode and a drain electrode arranged above the gate insulation layer; and
    forming an antioxidation metal protection layer on surfaces of each of the gate electrode, the source electrode, and the drain electrode,
    wherein when a common electrode is formed on the base substrate, the step of forming the pattern of the gate electrode on the base substrate comprises:
        depositing a transparent conductive layer and a gate metal layer made of a first elemental metal sequentially onto the base substrate;
        forming the pattern of the electrode on the gate metal layer and forming a pattern of the common electrode on the transparent conductive layer by a single patterning process;
        annealing the common electrode by placing the base substrate with the common electrode and the gate electrode into an annealing furnace; and
        immersing the base substrate with the annealed common electrode into a solution containing metal ions corresponding to a second elemental metal having chemical activity lower than the first elemental metal, and replacing the gate electrode made of the first elemental metal with the gate electrode made of the second elemental metal corresponding to the metal ions in the solution.

2. The method according to claim 1, wherein the metal protection layer is made of an elemental metal, and the gate electrode, the source electrode, and the drain electrode are each made of an elemental metal having chemical activity greater than the elemental metal of the metal protection layer.

3. The method according to claim 2, wherein the step of forming the metal protection layer comprises immersing the base substrate with the electrodes into a solution containing metal ions corresponding to the elemental metal of the metal protection layer, and replacing the elemental metal on the surface of each electrode with the metal ions in the solution, thereby forming the metal protection layer on the surface of each electrode.

4. The method according to claim 1, wherein the metal protection layer is formed on the surfaces of the gate electrode, the source electrode and the drain electrode, the metal protection layer is made of an elemental metal, and the gate electrode, the source electrode and the drain electrode are each made of an elemental metal having chemical activity greater than the elemental metal of the metal protection layer, the step of forming the antioxidation metal protection layer on the surface of the gate electrode comprises immersing the base substrate with the gate electrode into a solution containing metal ions corresponding to the elemental metal of the metal protection layer, and replacing the elemental metal on the surface of the gate electrode with the metal ions in the solution, thereby forming the metal protection layer on the surface of the gate electrode, and the step of forming the metal protection layer on the surfaces of the source electrode and the drain electrode comprises immersing the substrate with the source electrode and the drain electrode into a solution containing metal ions corresponding to the elemental metal of the metal protection layer, and replacing the elemental metal on the surfaces of the source electrode and the drain electrode with the metal ions in the solution, thereby forming the metal protection layer on the surfaces of the source electrode and the drain electrode.

5. The method according to claim 4, wherein the gate electrode, the source electrode and the drain electrode are each made of copper, and the metal protection layer is made of silver.

6. The method according to claim 1, wherein subsequent to depositing the gate insulation layer onto the base substrate and prior to forming the source electrode and the drain electrode, the method further comprises forming on the gate insulation layer a pattern of an active layer on which the source electrode and the drain electrode are arranged.

7. The method according to claim 2, wherein the metal protection layer is formed on the surfaces of the gate electrode, the source electrode and the drain electrode, the metal protection layer is made of an elemental metal, and the gate electrode, the source electrode and the drain electrode are each made of an elemental metal having chemical activity greater than the elemental metal of the metal protection layer, the step of forming the antioxidation metal protection layer on the surface of the gate electrode comprises immersing the base substrate with the gate electrode into a solution containing metal ions corresponding to the elemental metal of the metal protection layer, and replacing the elemental metal on the surface of the gate electrode with the metal ions in the solution, thereby forming the metal protection layer on the surface of the gate electrode, and the step of forming the metal protection layer on the surfaces of the source electrode and the drain electrode comprises immersing the substrate with the source electrode and the drain electrode into a solution containing metal ions corresponding to the elemental metal of the metal protection layer, and replacing the elemental metal on the surfaces of the source electrode and the drain electrode with the metal ions in the solution, thereby forming the metal protection layer on the surfaces of the source electrode and the drain electrode.

8. The method according to claim 3, wherein the metal protection layer is formed on the surfaces of the gate electrode, the source electrode and the drain electrode, the metal protection layer is made of an elemental metal, and the gate electrode, the source electrode and the drain electrode are each made of an elemental metal having chemical activity greater than the elemental metal of the metal protection layer, the step of forming the antioxidation metal protection layer on the surface of the gate electrode comprises immersing the base substrate with the gate electrode into a solution containing metal ions corresponding to the elemental metal of the metal protection layer, and replacing the elemental metal on the surface of the gate electrode with the metal ions in the solution, thereby forming the metal protection layer on the surface of the gate electrode, and the step of forming the metal protection layer on the surfaces of the source electrode and the drain electrode comprises immersing the substrate with the source electrode and the drain electrode into a solution containing metal ions corresponding to the elemental metal of the metal protection layer, and replacing the elemental metal on the surfaces of the source electrode and the drain electrode with the metal ions in the solution, thereby forming the metal protection layer on the surfaces of the source electrode and the drain electrode.

* * * * *